US011115018B1

(12) United States Patent
Ying

(10) Patent No.: US 11,115,018 B1
(45) Date of Patent: Sep. 7, 2021

(54) POWER TRANSISTOR OVERCURRENT PROTECTION CIRCUIT

(71) Applicant: SI EN TECHNOLOGY (XIAMEN) LIMITED, Xiamen (CN)

(72) Inventor: Kewei Ying, Xiamen (CN)

(73) Assignee: SI EN TECHNOLOGY (XIAMEN) LIMITED, Fujian (CN)

( * ) Notice: Subject to any disclaimer, the term of this patent is extended or adjusted under 35 U.S.C. 154(b) by 0 days.

(21) Appl. No.: 16/847,673

(22) Filed: Apr. 14, 2020

(51) Int. Cl.
*H03K 17/082* (2006.01)
*H02H 3/087* (2006.01)
*H02H 3/093* (2006.01)
*H02H 3/027* (2006.01)
*H02H 7/20* (2006.01)

(52) U.S. Cl.
CPC ......... *H03K 17/0822* (2013.01); *H02H 3/027* (2013.01); *H02H 3/087* (2013.01); *H02H 3/093* (2013.01); *H02H 7/20* (2013.01)

(58) Field of Classification Search
CPC ....... H03K 17/082–0828; H02H 3/027; H02H 3/08; H02H 3/087; H02H 3/093
See application file for complete search history.

(56) References Cited

U.S. PATENT DOCUMENTS

2009/0219661 A1* 9/2009 Mitsuda ............. H03K 17/0822
361/92

* cited by examiner

*Primary Examiner* — Danny Nguyen
*Assistant Examiner* — Christopher J Clark
(74) *Attorney, Agent, or Firm* — Leong C. Lei

(57) ABSTRACT

A power transistor overcurrent protection circuit includes an overcurrent detection circuit, a timing control circuit, and an enable control circuit. The overcurrent detection circuit is configured to detect whether there is an overcurrent flowing in the controlled power transistor. The timing control circuit and the enable control circuit jointly control the controlled power transistor. The power transistor overcurrent protection circuit can turn off the controlled power transistor so as to protect the controlled power transistor when there is an overcurrent flowing in the controlled power transistor for controlling a load to work or not to work.

11 Claims, 2 Drawing Sheets

POWER TRANSISTOR OVERCURRENT PROTECTION CIRCUIT

BACKGROUND OF THE INVENTION

1. Field of the Invention

The present invention relates to an electronic circuit, and more particularly to a power transistor overcurrent protection circuit.

2. Description of the Prior Art

In the field of electronic circuits, a power transistor is often used as a switching device for controlling a back-end load circuit. The back-end load circuit is controlled to work or not to work by turning on or off the power transistor. In the process of use, if the load is short-circuited to cause an overcurrent flowing in the power transistor, the power transistor will be easily damaged, resulting in a malfunction in the entire circuit.

SUMMARY OF THE INVENTION

The primary object of the present invention is to provide a power transistor overcurrent protection circuit, which can protect a controlled power transistor by turning off the controlled power transistor when an overcurrent flows in the controlled power transistor.

In order to achieve the above object, the present invention adopts the following technical solutions.

A power transistor overcurrent protection circuit is applied to a power transistor control circuit. The power transistor control circuit comprises a load and a controlled power transistor for controlling the load to work or not to work. The power transistor overcurrent protection circuit comprises an overcurrent detection circuit, a timing control circuit, and an enable control circuit.

The overcurrent detection circuit is connected to the controlled power transistor. The overcurrent detection circuit is configured to detect whether there is an overcurrent flowing in the controlled power transistor. If there is an overcurrent flowing in the controlled power transistor, an output terminal of the overcurrent detection circuit outputs an overcurrent signal. If there is no overcurrent flowing in the controlled power transistor, the output terminal of the overcurrent detection circuit outputs a normal signal.

The timing control circuit is connected to the output terminal of the overcurrent detection circuit. When the timing control circuit is powered on, an output terminal of the timing control circuit outputs an ON signal. After the timing control circuit is powered on, the signal output from the output terminal of the timing control circuit is controlled according to the signal output from the output terminal of the overcurrent detection circuit. If the output terminal of the overcurrent detection circuit outputs the overcurrent signal, the output terminal of the timing control circuit continuously outputs an OFF signal within a set time and outputs the ON signal again after reaching the set time. If the output terminal of the overcurrent detection circuit outputs the normal signal, the output terminal of the timing control circuit keeps outputting the ON signal.

The enable control circuit is connected to the output terminal of the timing control circuit and a gate of the controlled power transistor. The enable control circuit is configured to control the controlled power transistor to be turned on or off. The enable control circuit is controlled by the signal output from the output terminal of the timing control circuit and an enable signal. When the enable control circuit receives the OFF signal output from the timing control circuit, the enable control circuit turns off the controlled power transistor. When the enable control circuit receives the active enable signal and the ON signal output from the timing control circuit at the same time, the enable control circuit turns on the controlled power transistor.

In an embodiment of the present invention, the timing control circuit is connected to the overcurrent detection circuit through a signal conversion circuit. The overcurrent signal is a low-level signal. The normal signal is a high-level signal. An input terminal of the signal conversion circuit is connected to the output terminal of the overcurrent detection circuit. The signal conversion circuit is configured to perform a level conversion on the signal output from the output terminal of the overcurrent detection circuit. The signal conversion circuit converts the high-level normal signal into a low-level hold signal to be output to an input terminal of the timing control circuit. The signal conversion circuit converts the low-level overcurrent signal into a high-level trigger signal to be output to the input terminal of the timing control circuit. The input terminal of the timing control circuit is connected to an output terminal of the signal conversion circuit. After the timing control circuit is powered on, if the input terminal of the timing control circuit receives the hold signal, the output terminal of the timing control circuit keeps outputting the ON signal. If the signal received by the input terminal of the timing control circuit changes from the hold signal to the trigger signal, the output terminal of the timing control circuit continuously outputs the OFF signal within the set time and outputs the ON signal again after reaching the set time.

In an embodiment of the present invention, the controlled power transistor is a PMOS transistor. The source of the controlled power transistor is connected to a first DC power source. A drain of the controlled power transistor is connected to the load. The overcurrent detection circuit includes a second switching transistor, a second current source, and a comparator. The second switching transistor is a PMOS transistor. The second switching transistor has a transconductance less than that of the controlled power transistor. A source of the second switching transistor is connected to the first DC power source. A gate of the second switching transistor is connected to the gate of the controlled power transistor and an output terminal of the enable control circuit. A drain of the second switching transistor is connected to a negative input terminal of the comparator and grounded through the second current source. A positive input terminal of the comparator is connected to the drain of the controlled power transistor. An output terminal of the comparator serves as the output terminal of the overcurrent detection circuit. A power source terminal of the comparator is connected to the first DC power source. A ground terminal of the comparator is connected to a virtual ground circuit.

In an embodiment of the present invention, the virtual ground circuit includes a fourth switching transistor, a fourth resistor, a third current source, and a fourth current source. The fourth switching transistor is a PMOS transistor. One end of the fourth resistor is connected to the first DC power source. Another end of the fourth resistor is connected to an input terminal of the third current source and a gate of the fourth switching transistor. A source of the fourth switching transistor is connected to the ground terminal of the comparator. A drain of the fourth switching transistor is connected to an input terminal of the fourth current source. An output terminal of the third current source and an output terminal of the fourth current source are grounded.

In an embodiment of the present invention, the signal conversion circuit includes a third switching transistor, a first resistor, a second resistor, a third resistor, a first capacitor, and a Schmitt trigger. The third switching transistor is a PMOS transistor. A source of the third switching transistor is connected to the first DC power source. A gate of the third switching transistor serves as the input terminal of the signal conversion circuit. A drain of the third switching transistor is connected to one end of the first resistor. Another end of the first resistor is connected to one end of the third resistor and grounded through the second resistor. Another end of the third resistor is connected to an input terminal of the Schmitt trigger and grounded through the first capacitor. An output terminal of the Schmitt trigger serves as the output terminal of the signal conversion circuit.

In an embodiment of the present invention, the enable control circuit includes an AND gate, a first current source, a current limiting resistor, and a first switching transistor. The first switching transistor is a NMOS transistor. A first input terminal of the AND gate is used to access the enable signal. A second input terminal of the AND gate is connected to the output terminal of the timing control circuit. An output terminal of the AND gate is connected to a gate of the first switching transistor. One end of the current limiting resistor is connected to the first DC power source. Another end of the current limiting resistor is connected to a drain of the first switching transistor. A source of the first switching transistor is grounded through the first current source. A common terminal of the current limiting resistor and the first switching transistor serves as the output terminal of the enable control circuit and is connected to the gate of the controlled power transistor.

In an embodiment of the present invention, the controlled power transistor is a NMOS transistor. An input terminal of the load is connected to a first DC power source. A drain of the controlled power transistor is connected to an output terminal of the load. A source of the controlled power transistor is grounded. The overcurrent detection circuit includes a second switching transistor, a second current source, and a comparator. The second switching transistor is a NMOS transistor. The second switching transistor has a transconductance less than that of the controlled power transistor. An input terminal of the second current source is connected to the first DC power source. An output terminal of the second current source is connected to a drain of the second switching transistor and a positive input terminal of the comparator. A gate of the second switching transistor is connected to the gate of the controlled power transistor and an output terminal of the enable control circuit. A source of the second switching transistor is grounded. A negative input terminal of the comparator is connected to the drain of the controlled power transistor. A power source terminal of the comparator is connected to a second DC power source. A ground terminal of the comparator is grounded.

In an embodiment of the present invention, the signal conversion circuit includes a third switching transistor, a first resistor, a second resistor, a third resistor, a first capacitor, and a Schmitt trigger. The third switching transistor is a PMOS transistor. Wherein, a source of the third switching transistor is connected to the second DC power source. A gate of the third switching transistor serves as the input terminal of the signal conversion circuit. A drain of the third switching transistor is connected to one end of the first resistor. Another end of the first resistor is connected to one end of the third resistor and grounded through the second resistor. Another end of the third resistor is connected to an input terminal of the Schmitt trigger and grounded through the first capacitor. An output terminal of the Schmitt trigger serves as the output terminal of the signal conversion circuit.

In an embodiment of the present invention, the enable control circuit includes an AND gate. Wherein, a first input terminal of the AND gate is used to access the enable signal. A second input terminal of the AND gate is connected to the output terminal of the timing control circuit. An output terminal of the AND gate serves as the output terminal of the enable control circuit and is connected to the gate of the controlled power transistor.

In an embodiment of the present invention, the timing control circuit includes a D-type flip-flop and a counter. An input terminal of the D-type flip-flop is connected to the second DC power source. A clock terminal of the D-type flip-flop is connected to an enable terminal of the counter and serves as the input terminal of the timing control circuit. An output terminal of the counter is connected to a reset terminal of the D-type flip-flop. A negative output terminal of the D-type flip-flop serves as the output terminal of the timing control circuit.

In the present invention, when there is an overcurrent flowing in the controlled power transistor, the timing control circuit can output an OFF signal to the enable control circuit, so that the enable control circuit turns off the controlled power transistor to achieve overcurrent protection and to avoid the controlled power transistor from being damaged due to excessive current. After an overcurrent occurs in the controlled power transistor, the timing control circuit continues to output an OFF signal to the enable control circuit within a set time and then outputs an ON signal to the enable control circuit again, so that the enable control circuit can control the controlled power transistor to be turned on again so as to restart the controlled power transistor. After the controlled power transistor is turned on again, if there is no overcurrent flowing in the controlled power transistor, the controlled power transistor works normally and the circuit returns to the normal working state. If there is still an overcurrent flowing in the controlled power transistor, the timing control circuit and the enable control circuit will turn off the controlled power transistor again to protect the controlled power transistor.

DETAILED DESCRIPTION OF THE PREFERRED EMBODIMENTS

Embodiments of the present invention will now be described, by way of example only, with reference to the accompanying drawings.

Figure 1:
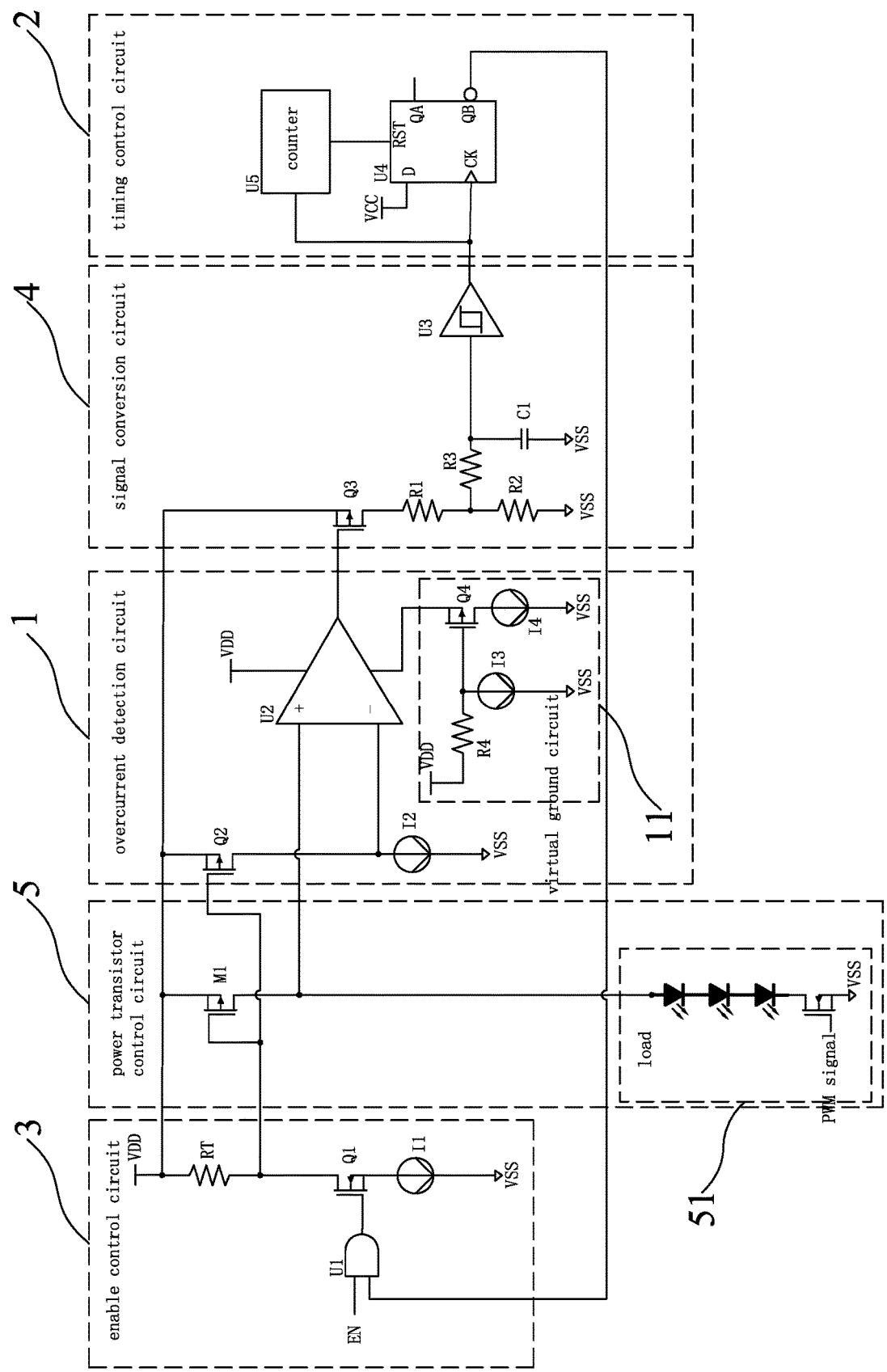
FIG. 1 is a circuit diagram according to a first embodiment of the present invention.
Figure 2:
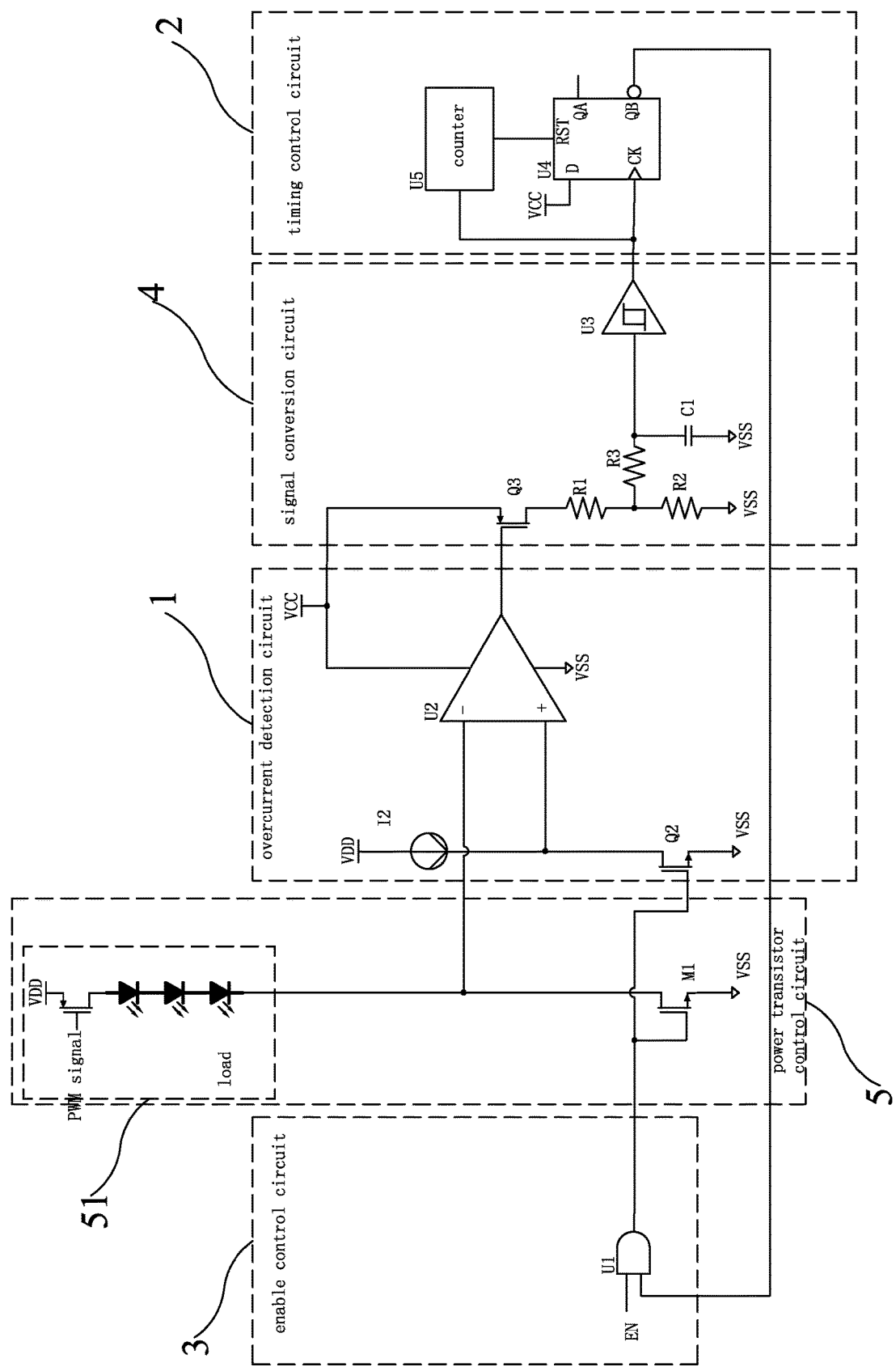
FIG. 2 is a circuit diagram according to a second embodiment of the present invention.

As shown in FIG. 1 and FIG. 2, the present invention discloses a power transistor overcurrent protection circuit applied to a power transistor control circuit 5. The power transistor control circuit 5 includes a load 51 and a controlled power transistor M1 for controlling the load 51 to work or not to work.

With reference to FIG. 1 and FIG. 2, the power transistor overcurrent protection circuit of the present invention comprises an overcurrent detection circuit 1, a timing control circuit 2, and an enable control circuit 3.

With reference to FIG. 1 and FIG. 2, the overcurrent detection circuit 1 is connected to the controlled power transistor M1. The overcurrent detection circuit 1 is configured to detect whether there is an overcurrent flowing in the controlled power transistor M1. If there is an overcurrent flowing in the controlled power transistor M1, an output terminal of the overcurrent detection circuit 1 will output an overcurrent signal. If there is no overcurrent flowing in the controlled power transistor M1, the output terminal of the overcurrent detection circuit 1 will output a normal signal.

With reference to FIG. 1 and FIG. 2, the timing control circuit 2 is connected to the output terminal of the overcurrent detection circuit 1. When the timing control circuit 2 is powered on, an output terminal of the timing control circuit 2 outputs an ON signal. After the timing control circuit 2 is powered on, the signal output from the output terminal of the timing control circuit 2 is controlled according to the signal output from the output terminal of the overcurrent detection circuit 1. If the output terminal of the overcurrent detection circuit 1 outputs the overcurrent signal, the output terminal of the timing control circuit 2 continuously outputs an OFF signal within a set time and outputs the ON signal again after reaching the set time. If the output terminal of the overcurrent detection circuit 1 outputs the normal signal, the output terminal of the timing control circuit 2 keeps outputting the ON signal. As shown in FIG. 1 and FIG. 2, the overcurrent signal is a low-level signal, and the normal signal is a high-level signal. The timing control circuit 2 is connected to the overcurrent detection circuit 1 through a signal conversion circuit 4. An input terminal of the signal conversion circuit 4 is connected to the output terminal of the overcurrent detection circuit 1. The signal conversion circuit 4 is configured to perform a level conversion on the signal output from the output terminal of the overcurrent detection circuit 1. The signal conversion circuit 4 converts the high-level normal signal into a low-level hold signal to be output to an input terminal of the timing control circuit 2. The signal conversion circuit 4 converts the low-level overcurrent signal into a high-level trigger signal to be output to the input terminal of the timing control circuit 2. The input terminal of the timing control circuit 2 is connected to an output terminal of the signal conversion circuit 4. After the timing control circuit 2 is powered on, if the input terminal of the timing control circuit 2 receives the hold signal, the output terminal of the timing control circuit 2 keeps outputting the ON signal. If the signal received by the input terminal of the timing control circuit 2 changes from the hold signal to the trigger signal, the output terminal of the timing control circuit 2 continuously outputs the OFF signal within the set time and outputs the ON signal again after reaching the set time.

As shown in FIG. 1 and FIG. 2, the enable control circuit 3 is connected to the output terminal of the timing control circuit 2 and the gate of the controlled power transistor M1. The enable control circuit 3 is configured to control the controlled power transistor M1 to be turned on or off. The enable control circuit 3 is controlled by the signal output from the output terminal of the timing control circuit 2 and an enable signal EN. When the enable control circuit 3 receives the OFF signal output from the timing control circuit 2, the enable control circuit 3 turns off the controlled power transistor M1. When the enable control circuit 3 receives the active enable signal EN and the ON signal output from the timing control circuit 2 at the same time, the enable control circuit 3 turns on the controlled power transistor M1.

With reference to FIG. 1 and FIG. 2, the working principle of the present invention is described below.

When the power transistor overcurrent protection circuit of the invention starts to work, the timing control circuit 2 outputs an ON signal to the enable control signal and the enable control circuit 3 receives the active enable signal EN, so that the enable control circuit 3 controls the controlled power transistor M1 to be turned on.

After the controlled power transistor M1 is turned on, if the current of the controlled power transistor M1 is normal, the overcurrent detection circuit 1 will output a normal signal to the signal conversion circuit 4. The signal conversion circuit converts the received normal signal into a hold signal and outputs the hold signal to the timing control circuit 2. The input terminal of the timing control circuit 2 receives the hold signal and keeps outputting the ON signal to the enable control circuit 3, thereby ensuring that the controlled power transistor M1 is turned on.

After the controlled power transistor M1 is turned on, if there is an overcurrent flowing in the controlled power transistor M1, the overcurrent detection circuit 1 outputs an overcurrent signal to the signal conversion circuit 4. The signal conversion circuit converts the received overcurrent signal into a trigger signal and outputs the trigger signal to the timing control circuit 2. The signal received by the input terminal of the timing control circuit 2 changes from the hold signal to the trigger signal. The timing control circuit 2 outputs an OFF signal to the enable control circuit 3 within a set time, so that the enable control circuit 3 turns off the controlled power transistor M1, so as to achieve overcurrent protection and to prevent the controlled power transistor M1 from being damaged due to excessive current. After the timing control circuit 2 outputs an OFF signal to the enable control circuit 3 within the set time, the timing control circuit 2 will re-output an ON signal to the enable control circuit 3, so that the enable control circuit 3 can control the controlled power transistor M1 to be turned on again to restart the controlled power transistor M1. After the controlled power transistor M1 is turned on again, if there is no overcurrent flowing in the controlled power transistor M1, the controlled power transistor M1 works normally and the circuit returns to the normal working state. If there is still an overcurrent flowing in the controlled power transistor M1, the timing control circuit 2 and the enable control circuit 3 will turn off the controlled power transistor M1 again to protect the controlled power transistor M1.

In order to further explain the technical solution of the present invention, two embodiments of the present invention are described in detail below.

First Embodiment

As shown in FIG. 1, in the first embodiment of the present invention, the controlled power transistor M1 of the power transistor control circuit 5 is a PMOS transistor. The source of the controlled power transistor M1 is connected to a first DC power source VDD. The drain of the controlled power transistor M1 is connected to the load 51.

As shown in FIG. 1, in the first embodiment of the present invention, the overcurrent detection circuit 1 includes a second switching transistor Q2, a second current source I2, and a comparator U2. The second switching transistor Q2 is a PMOS transistor. The transconductance of the second switching transistor Q2 is less than the transconductance of the controlled power transistor M1. The source of the second switching transistor Q2 is connected to the first DC power source VDD. The gate of the second switching transistor Q2 is connected to the gate of the controlled power transistor M1 and an output terminal of the enable control circuit 3. The drain of the second switching transistor Q2 is connected to a negative input terminal of the comparator U2 and grounded through the second current source I2. A positive input terminal of the comparator U2 is connected to an output terminal of the controlled power transistor M1. An output terminal of the comparator U2 serves as the output terminal of the overcurrent detection circuit 1 and is connected to the signal conversion circuit 4. Thus, when the enable control circuit 3 controls the controlled power transistor M1 to be turned on, the second switching transistor Q2 is also turned synchronously. When the enable control circuit 3 controls the controlled power transistor M1 to be turned off, the second switching transistor Q2 is also turned off synchronously, thereby reducing energy consumption. The sources of the second switching transistor Q2 and the controlled power transistor M1 are both connected to the first DC power source VDD. The gates of the second switching transistor Q2 and the controlled power transistor M1 are both connected to the output terminal of the enable control circuit 3. The second switching transistor Q2 and the controlled power transistor M1 are the same type of field effect transistor. Thus, when the controlled power transistor M1 and the second switching transistor Q2 are turned on, if the voltages at the drains of the controlled power transistor M1 and the second switching transistor Q2 are equal, that is, the voltage at the positive input terminal of the comparator U2 is equal to the voltage at the negative input terminal of the comparator U2, the current of the controlled power transistor M1 is N times the current of the second switching transistor Q2, where N is equal to the transconductance of the controlled power transistor M1 divided by the transconductance of the second switching transistor Q2. If the voltage at the drain of the controlled power transistor M1 is less than the voltage at the drain of the second switching transistor Q2, that is, the voltage at the positive input terminal of the comparator U2 is less than the voltage at the negative input terminal of the comparator U2, the current of the controlled power transistor M1 is greater than N times the current of the second switching transistor Q2, and the comparator U2 outputs a low-level overcurrent signal. If the voltage at the drain of the controlled power transistor M1 is greater than the voltage at the drain of the second switching transistor Q2, that is, the voltage at the positive input terminal of the comparator U2 is greater than the voltage at the negative input terminal of the comparator U2, the current of the controlled power transistor M1 is less than N times the current of the second switching transistor Q2, and the comparator U2 outputs a high-level normal signal. Thus, N times the current of the second switching transistor Q2 is set as the overcurrent threshold of the controlled power transistor M1. When there is no overcurrent flowing in the controlled power transistor M1, the current of the controlled power transistor M1 is less than the overcurrent threshold, the voltage at the positive input terminal of the comparator U2 is greater than the voltage at the negative input terminal of the comparator U2, and the comparator U2 outputs a high-level normal signal. When there is an overcurrent flowing in the controlled power transistor M1, the current of the controlled power transistor M1 is greater than the overcurrent threshold, the voltage at the positive input terminal of the comparator U2 is less than the voltage at the negative input terminal of the comparator U2, and the comparator U2 outputs a low-level overcurrent signal.

As shown in FIG. 1, in the first embodiment of the present invention, a power source terminal of the comparator U2 of the overcurrent detection circuit 1 is connected to the first DC power source VDD, and a ground terminal of the comparator U2 is connected to a virtual ground circuit 11. The virtual ground circuit 11 includes a fourth switching transistor Q4, a fourth resistor R4, a third current source I3, and a fourth current source I4. The fourth switching transistor Q4 is a PMOS transistor. One end of the fourth resistor R4 is connected to the first DC power source VDD, and another end of the fourth resistor R4 is connected to an input terminal of the third current source I3 and the gate of the fourth switching transistor Q4. The source of the fourth switching transistor Q4 is connected to the ground terminal of the comparator U2. The drain of the fourth switching transistor Q4 is connected to an input terminal of the fourth current source I4. An output terminal of the third current source I3 and an output terminal of the fourth current source I4 are grounded. Thus, the voltage Vgnd at the ground terminal of the comparator U2 is Vgnd=vdd−i3*r4+Vgs, where vdd is the voltage of the first DC power source VDD, i3 is the current of the third current source I3, r4 is the resistance of the fourth resistor R4, and Vgs is the voltage at the source and gate of the fourth switching transistor Q4 when turned on, so that the voltage difference between the power source terminal and the ground terminal of the comparator U2 is Vu2=i3*r4−Vgs. Thus, by setting the current of the third current source I3 and the resistance of the fourth resistor R4, the comparator U2 can be operated in a low voltage region lower than the voltage of the first DC power source VDD (the low voltage region refers to a voltage less than 5V). The comparator U2 may use a low-voltage device. The voltage of the first DC power source VDD may be a high voltage greater than 60V.

As shown in FIG. 1, in the first embodiment of the present invention, the signal conversion circuit 4 includes a third switching transistor Q3, a first resistor R1, a second resistor R2, a third resistor R3, a first capacitor C1, and a Schmitt trigger U3. The third switching transistor Q3 is a PMOS transistor. The source of the third switching transistor Q3 is connected to the first DC power source VDD. The gate of the third switching transistor Q3 serves as the input terminal of the signal conversion circuit 4 and is connected to the output terminal of the overcurrent detection circuit 1. The drain of the third switching transistor Q3 is connected to one end of the first resistor R1. Another end of the first resistor R1 is connected to one end of the third resistor R3 and grounded through the second resistor R2. Another end of the third resistor R3 is connected to an input terminal of the Schmitt trigger U3 and grounded through the first capacitor C1. An output terminal of the Schmitt trigger U3 serves as the output terminal of the signal conversion circuit 4. Thus, when a high-level normal signal is input to the signal conversion circuit 4, the third switching transistor Q3 is turned off, so that the voltage at the input terminal of the Schmitt trigger U3 is a low level, and the output terminal of the Schmitt trigger U3 outputs a low-level hold signal. When a low-level overcurrent signal is input to the signal conversion circuit 4, the third switching transistor Q3 is turned on, so that the voltage at the input terminal of the Schmitt trigger U3 is a high level, and the output terminal of the Schmitt trigger U3 outputs a high-level trigger signal. The first resistor R1 and the second resistor R2 can perform voltage division operations, so that the Schmitt trigger U3 can work in a low voltage region lower than the voltage of the first DC power source VDD, and the back-end timing control circuit 2 can also work in a low voltage region lower than the voltage of the first DC power source VDD. The Schmitt trigger U3 and the timing control circuit 2 can use low-voltage devices. In addition, the Schmitt trigger U3 can stabilize the voltage of the hold signal and the trigger signal.

As shown in FIG. 1, in the first embodiment of the present invention, the timing control circuit 2 includes a D-type flip-flop U4 and a counter U5. The initial state of a positive output terminal of D-type flip-flop U4 is a low level. An input terminal of the D-type flip-flop U4 is connected to a second DC power source VCC. The voltage of the second DC power source VCC may be lower than the voltage of the first DC power source VDD. A clock terminal of the D-type flip-flop U4 is connected to an enable terminal of the counter U5 and serves as the input terminal of the timing control circuit 2. An output terminal of the counter U5 is connected to a reset terminal of the D-type flip-flop U4. A negative output terminal of the D-type flip-flop U4 serves as the output terminal of the timing control circuit 2 and is connected to the enable control circuit 3. Thus, when the timing control circuit 2 is powered on, the negative output terminal of the D-type flip-flop U4 outputs a high-level ON signal. When the signal received at the input terminal of the timing control circuit 2 changes from the hold signal to the trigger signal, that is, when the signal received at the input terminal of the timing control circuit 2 generates a rising edge, the D-type flip-flop U4 is triggered, so that the negative output terminal of the D-type flip-flop U4 outputs a low-level OFF signal. At the time, the counter U5 starts counting. After the counting of the set time, the counter U5 outputs a signal to the reset terminal of the D-type flip-flop U4 to reset the D-type flip-flop U4, and the negative output terminal of the D-type flip-flop U4 outputs a high-level ON signal again.

As shown in FIG. 1, in the first embodiment of the present invention, the enable control circuit 3 includes an AND gate U1, a first current source I1, a current limiting resistor RT, and a first switching transistor Q1. The first switching transistor Q1 is a NMOS transistor. A first input terminal of the AND gate U1 is used to access the enable signal EN. A second input terminal of the AND gate U1 is connected to the output terminal of the timing control circuit 2 to access an output signal of the timing control circuit 2. An output terminal of the AND gate U1 is connected to the gate of the first switching transistor Q1. One end of the current limiting resistor RT is connected to the first DC power source VDD. Another end of the current limiting resistor RT is connected to the drain of the first switching transistor Q1. The source of the first switching transistor Q1 is grounded through the first current source I1. A common terminal of the current limiting resistor RT and the first switching transistor Q1 serves as the output terminal of the enable control circuit 3 and is connected to the gate of the controlled power transistor M1. The enable signal EN is active in high level. When the first input terminal and the second input terminal of the AND gate U1 access the high-level enable signal EN and the high-level ON signal, respectively, the AND gate U1 outputs a high level to the first switching transistor Q1 so that the first switching transistor Q1 is turned on, and the controlled power transistor M1 and the second switching transistor Q2 are controlled to be turned on. When the second input terminal of the AND gate U1 accesses the low-level OFF signal, the AND gate U1 outputs a low level to the first switching transistor Q1 so that the first switching transistor Q1 is turned off, and the controlled power transistor M1 and the second switching transistor Q2 are controlled to be turned off.

Second Embodiment

As shown in FIG. 2, in the second embodiment of the present invention, the controlled power transistor M1 of the power transistor control circuit 5 is a NMOS transistor. An input terminal of the load 51 is connected to a first DC power source VDD. An output terminal of the load 51 is connected to the drain of the controlled power transistor M1. The source of the controlled power transistor M1 is grounded.

As shown in FIG. 2, in the second embodiment of the present invention, the overcurrent detection circuit 1 includes a second switching transistor Q2, a second current source I2, and a comparator U2. The second switching transistor Q2 is a NMOS transistor. The transconductance of the second switching transistor Q2 is less than the transconductance of the controlled power transistor M1. An input terminal of the second current source I2 is connected to the first DC power source VDD. An output terminal of the second current source I2 is connected to the drain of the second switching transistor Q2 and a positive input terminal of the comparator U2. The gate of the second switching transistor Q2 is connected to the gate of the controlled power transistor M1 and an output terminal of the enable control circuit 3. The source of the second switching transistor Q2 is grounded. A negative input terminal of the comparator U2 is connected to the drain of the controlled power transistor M1. A power source terminal of the comparator U2 is connected to a second DC power source VCC. A ground terminal of the comparator U2 is grounded. Thus, when the enable control circuit 3 controls the controlled power transistor M1 to be turned on, the second switching transistor Q2 is also turned on synchronously. When the enable control circuit 3 controls the controlled power transistor M1 to be turned off, the second switching transistor Q2 is also turned off synchronously, thereby reducing energy consumption. The sources of the second switching transistor Q2 and the controlled power transistor M1 are grounded. The input terminals of the load 51 and the second current source I2 are connected to the first DC power source VDD. The gates of the second switching transistor Q2 and the controlled power transistor M1 are both connected to the output terminal of the enable control circuit 3. The second switching transistor Q2 and the controlled power transistor M1 are the same type of field effect transistor. Thus, when the controlled power transistor M1 and the second switching transistor Q2 are turned on, if the voltages at the drains of the controlled power transistor M1 and the second switching transistor Q2 are equal, that is, the voltage at the positive input terminal of the comparator U2 is equal to the voltage at the negative input terminal of the comparator U2, the current of the controlled power transistor M1 is N times the current of the second switching transistor Q2, where N is equal to the transconductance of the controlled power transistor M1 divided by the transconductance of the second switching transistor Q2. If the voltage at the drain of the controlled power transistor M1 is greater than the voltage at the drain of the second switching transistor Q2, that is, the voltage at the positive input terminal of the comparator U2 is less than the voltage at the negative input terminal of the comparator U2, the current of the controlled power transistor M1 is greater than N times the current of the second switching transistor Q2, and the comparator U2 outputs a low-level overcurrent signal. If the voltage at the drain of the controlled power transistor M1 is less than the voltage at the drain of the second switching transistor Q2, that is, the voltage at the positive input terminal of the comparator U2 is greater than the voltage at the negative input terminal of the comparator U2, the current of the controlled power transistor M1 is less than N times the current of the second switching transistor Q2, and the comparator U2 outputs a high-level normal signal. Thus, N times the current of the second switching transistor Q2 is set as the overcurrent threshold of the controlled power transistor M1. When there is no overcurrent flowing in the controlled power transistor M1, the current of the controlled power transistor M1 is less than the overcurrent threshold, the voltage at the positive input terminal of the comparator U2 is greater than the voltage at the negative input terminal of the comparator U2, and the comparator U2 outputs a high-level normal signal. When there is an overcurrent flowing in the controlled power transistor M1, the current of the controlled power transistor M1 is greater than the overcurrent threshold, the voltage at the positive input terminal of the comparator U2 is less than the voltage at the negative input terminal of the comparator U2, and the comparator U2 outputs a low-level overcurrent signal.

As shown in FIG. 2, in the second embodiment of the present invention, the signal conversion circuit 4 includes a third switching transistor Q3, a first resistor R1, a second resistor R2, a third resistor R3, a first capacitor C1, and a Schmitt trigger U3. The third switching transistor Q3 is a PMOS transistor. The source of the third switching transistor Q3 is connected to the second DC power source VCC. The gate of the third switching transistor Q3 serves as the input terminal of the signal conversion circuit 4 and is connected to the output terminal of the overcurrent detection circuit 1. The drain of the third switching transistor Q3 is connected to one end of the first resistor R1. Another end of the first resistor R1 is connected to one end of the third resistor R3 and grounded through the second resistor R2. Another end of the third resistor R3 is connected to an input terminal of the Schmitt trigger U3 and grounded through the first capacitor C1. An output terminal of the Schmitt trigger U3 serves as the output terminal of the signal conversion circuit 4. Thus, when a high-level normal signal is input to the signal conversion circuit 4, the third switching transistor Q3 is turned off, so that the voltage at the input terminal of the Schmitt trigger U3 is a low level, and the output terminal of the Schmitt trigger U3 outputs a low-level hold signal. When a low-level overcurrent signal is input to the signal conversion circuit 4, the third switching transistor Q3 is turned on, so that the voltage at the input terminal of the Schmitt trigger U3 is a high level, and the output terminal of the Schmitt trigger U3 outputs a high-level trigger signal. The first resistor R1 and the second resistor R2 can perform voltage division operations to reduce the voltage. In addition, the Schmitt trigger U3 can stabilize the voltage of the hold signal and the trigger signal.

As shown in FIG. 2, in the second embodiment of the present invention, the timing control circuit 2 includes a D-type flip-flop U4 and a counter U5. The initial state of a positive output terminal of D-type flip-flop U4 is a low level. An input terminal of the D-type flip-flop U4 is connected to a second DC power source VCC. The voltage of the second DC power source VCC may be lower than the voltage of the first DC power source VDD. A clock terminal of the D-type flip-flop U4 is connected to an enable terminal of the counter U5 and serves as the input terminal of the timing control circuit 2. An output terminal of the counter U5 is connected to a reset terminal of the D-type flip-flop U4. A negative output terminal of the D-type flip-flop U4 serves as the output terminal of the timing control circuit 2 to be connected to the enable control circuit 3. Thus, when the timing control circuit 2 is powered on, the negative output terminal of the D-type flip-flop U4 outputs a high-level ON signal. When the signal received at the input terminal of the timing control circuit 2 changes from the hold signal to the trigger signal, that is, when the signal received at the input terminal of the timing control circuit 2 generates a rising edge, the D-type flip-flop U4 is triggered, so that the negative output terminal of the D-type flip-flop U4 outputs a low-level OFF signal. At the time, the counter U5 starts counting. After the counting of the set time, the counter U5 outputs a signal to the reset terminal of the D-type flip-flop U4 to reset the D-type flip-flop U4, and the negative output terminal of the D-type flip-flop U4 outputs a high-level ON signal again.

As shown in FIG. 2, in the second embodiment of the present invention, the enable control circuit 3 includes an AND gate U1. A first input terminal of the AND gate U1 is used to access the enable signal EN. A second input terminal of the AND gate U1 is connected to the output terminal of the timing control circuit 2 to access an output signal of the timing control circuit 2. An output terminal of the AND gate U1 serves as the output terminal of the enable control circuit 3. The enable signal EN is active in high-level. When the first input terminal and the second input terminal of the AND gate U1 access the high-level enable signal EN and the high-level ON signal, respectively, the AND gate U1 outputs a high level to the gates of the controlled power transistor M1 and the second switching transistor Q2, thereby controlling the controlled power transistor M1 and the second switching transistor Q2 to be turned on. When the second input terminal of the AND gate U1 accesses the low-level OFF signal, the AND gate U1 outputs a low level to the gates of the controlled power transistor M1 and the second switching transistor Q2 so that the controlled power transistor M1 and the second switching transistor Q2 are turned off.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:
1. A power transistor overcurrent protection circuit, applied to a power transistor control circuit, the power transistor control circuit comprising a load and a controlled power transistor for controlling the load to work or not to work, the power transistor overcurrent protection circuit comprising:
an overcurrent detection circuit, connected to the controlled power transistor; the overcurrent detection circuit being configured to detect whether there is an overcurrent flowing in the controlled power transistor; wherein if there is an overcurrent flowing in the controlled power transistor, an output terminal of the overcurrent detection circuit outputs an overcurrent signal; if there is no overcurrent flowing in the controlled power transistor, the output terminal of the overcurrent detection circuit outputs a normal signal;
a timing control circuit, connected to the output terminal of the overcurrent detection circuit; wherein when the timing control circuit is powered on, an output terminal of the timing control circuit outputs an ON signal; after the timing control circuit is powered on, the signal output from the output terminal of the timing control circuit is controlled according to the signal output from the output terminal of the overcurrent detection circuit; if the output terminal of the overcurrent detection circuit outputs the overcurrent signal, the output terminal of the timing control circuit continuously outputs an OFF signal within a set time and outputs the ON signal again after reaching the set time; if the output terminal of the overcurrent detection circuit outputs the normal signal, the output terminal of the timing control circuit keeps outputting the ON signal;

an enable control circuit, connected to the output terminal of the timing control circuit and a gate of the controlled power transistor; the enable control circuit being configured to control the controlled power transistor to be turned on or off, the enable control circuit being controlled by the signal output from the output terminal of the timing control circuit and an enable signal; wherein when the enable control circuit receives the OFF signal output from the timing control circuit, the enable control circuit turns off the controlled power transistor; when the enable control circuit receives the active enable signal and the ON signal output from the timing control circuit at the same time, the enable control circuit turns on the controlled power transistor;

wherein the timing control circuit is connected to the overcurrent detection circuit through a signal conversion circuit;

the overcurrent signal is a low-level signal, the normal signal is a high-level signal;

an input terminal of the signal conversion circuit is connected to the output terminal of the overcurrent detection circuit; the signal conversion circuit is configured to perform a level conversion on the signal output from the output terminal of the overcurrent detection circuit, the signal conversion circuit converts the high-level normal signal into a low-level hold signal to be output to an input terminal of the timing control circuit, the signal conversion circuit converts the low-level overcurrent signal into a high-level trigger signal to be output to the input terminal of the timing control circuit;

the input terminal of the timing control circuit is connected to an output terminal of the signal conversion circuit, after the timing control circuit is powered on, if the input terminal of the timing control circuit receives the hold signal, the output terminal of the timing control circuit keeps outputting the ON signal; if the signal received by the input terminal of the timing control circuit changes from the hold signal to the trigger signal, the output terminal of the timing control circuit continuously outputs the OFF signal within the set time and outputs the ON signal again after reaching the set time.

2. The power transistor overcurrent protection circuit as claimed in claim 1, wherein the timing control circuit includes a D-type flip-flop and a counter; an initial state of a positive output terminal of the D-type flip-flop is a low level;

wherein an input terminal of the D-type flip-flop is connected to a second DC power source, a clock terminal of the D-type flip-flop is connected to an enable terminal of the counter and serves as the input terminal of the timing control circuit, an output terminal of the counter is connected to a reset terminal of the D-type flip-flop, and a negative output terminal of the D-type flip-flop serves as the output terminal of the timing control circuit.

3. The power transistor overcurrent protection circuit as claimed in claim 1, wherein the controlled power transistor is a PMOS transistor, a source of the controlled power transistor is connected to a first DC power source, a drain of the controlled power transistor is connected to the load; the overcurrent detection circuit includes a second switching transistor, a second current source, and a comparator; the second switching transistor is a PMOS transistor, the second switching transistor has a transconductance less than that of the controlled power transistor; a source of the second switching transistor is connected to the first DC power source, a gate of the second switching transistor is connected to the gate of the controlled power transistor and an output terminal of the enable control circuit, a drain of the second switching transistor is connected to a negative input terminal of the comparator and grounded through the second current source; a positive input terminal of the comparator is connected to the drain of the controlled power transistor, an output terminal of the comparator serves as the output terminal of the overcurrent detection circuit, a power source terminal of the comparator is connected to the first DC power source, and a ground terminal of the comparator is connected to a virtual ground circuit.

4. The power transistor overcurrent protection circuit as claimed in claim 3, wherein the virtual ground circuit includes a fourth switching transistor, a fourth resistor, a third current source, and a fourth current source, the fourth switching transistor is a PMOS transistor; one end of the fourth resistor is connected to the first DC power source, another end of the fourth resistor is connected to an input terminal of the third current source and a gate of the fourth switching transistor, a source of the fourth switching transistor is connected to the ground terminal of the comparator, a drain of the fourth switching transistor is connected to an input terminal of the fourth current source, an output terminal of the third current source and an output terminal of the fourth current source are grounded.

5. The power transistor overcurrent protection circuit as claimed in claim 3, wherein the signal conversion circuit includes a third switching transistor, a first resistor, a second resistor, a third resistor, a first capacitor, and a Schmitt trigger, the third switching transistor is a PMOS transistor;

wherein a source of the third switching transistor is connected to the first DC power source, a gate of the third switching transistor serves as the input terminal of the signal conversion circuit, a drain of the third switching transistor is connected to one end of the first resistor, another end of the first resistor is connected to one end of the third resistor and grounded through the second resistor, another end of the third resistor is connected to an input terminal of the Schmitt trigger and grounded through the first capacitor, an output terminal of the Schmitt trigger serves as the output terminal of the signal conversion circuit.

6. The power transistor overcurrent protection circuit as claimed in claim 3, wherein the enable control circuit includes an AND gate, a first current source, a current limiting resistor, and a first switching transistor, the first switching transistor is a NMOS transistor; a first input terminal of the AND gate is used to access the enable signal, a second input terminal of the AND gate is connected to the output terminal of the timing control circuit, an output terminal of the AND gate is connected to a gate of the first switching transistor; one end of the current limiting resistor is connected to the first DC power source, another end of the current limiting resistor is connected to a drain of the first switching transistor, a source of the first switching transistor is grounded through the first current source; a common terminal of the current limiting resistor and the first switching transistor serves as the output terminal of the enable control circuit and is connected to the gate of the controlled power transistor.

7. The power transistor overcurrent protection circuit as claimed in claim 6, wherein the timing control circuit includes a D-type flip-flop and a counter; an initial state of a positive output terminal of the D-type flip-flop is a low level;

wherein an input terminal of the D-type flip-flop is connected to a second DC power source, a clock terminal of the D-type flip-flop is connected to an enable terminal of the counter and serves as the input terminal of the timing control circuit, an output terminal of the counter is connected to a reset terminal of the D-type flip-flop, and a negative output terminal of the D-type flip-flop serves as the output terminal of the timing control circuit.

8. The power transistor overcurrent protection circuit as claimed in claim 1, wherein the controlled power transistor is a NMOS transistor, an input terminal of the load is connected to a first DC power source, a drain of the controlled power transistor is connected to an output terminal of the load, a source of the controlled power transistor is grounded;

the overcurrent detection circuit includes a second switching transistor, a second current source, and a comparator; the second switching transistor is a NMOS transistor, the second switching transistor has a transconductance less than that of the controlled power transistor; an input terminal of the second current source is connected to the first DC power source, an output terminal of the second current source is connected to a drain of the second switching transistor and a positive input terminal of the comparator, a gate of the second switching transistor is connected to the gate of the controlled power transistor and an output terminal of the enable control circuit, a source of the second switching transistor is grounded; a negative input terminal of the comparator is connected to the drain of the controlled power transistor, a power source terminal of the comparator is connected to a second DC power source, and a ground terminal of the comparator is grounded.

9. The power transistor overcurrent protection circuit as claimed in claim 8, wherein the signal conversion circuit includes a third switching transistor, a first resistor, a second resistor, a third resistor, a first capacitor, and a Schmitt trigger, the third switching transistor is a PMOS transistor;

wherein a source of the third switching transistor is connected to the second DC power source, a gate of the third switching transistor serves as the input terminal of the signal conversion circuit, a drain of the third switching transistor is connected to one end of the first resistor, another end of the first resistor is connected to one end of the third resistor and grounded through the second resistor, another end of the third resistor is connected to an input terminal of the Schmitt trigger and grounded through the first capacitor, and an output terminal of the Schmitt trigger serves as the output terminal of the signal conversion circuit.

10. The power transistor overcurrent protection circuit as claimed in claim 8, wherein the enable control circuit includes an AND gate; wherein a first input terminal of the AND gate is used to access the enable signal, a second input terminal of the AND gate is connected to the output terminal of the timing control circuit, and an output terminal of the AND gate serves as the output terminal of the enable control circuit and is connected to the gate of the controlled power transistor.

11. The power transistor overcurrent protection circuit as claimed in claim 10, wherein the timing control circuit includes a D-type flip-flop and a counter; an initial state of a positive output terminal of the D-type flip-flop is a low level;

wherein an input terminal of the D-type flip-flop is connected to the second DC power source, a clock terminal of the D-type flip-flop is connected to an enable terminal of the counter and serves as the input terminal of the timing control circuit, an output terminal of the counter is connected to a reset terminal of the D-type flip-flop, and a negative output terminal of the D-type flip-flop serves as the output terminal of the timing control circuit.

\* \* \* \* \*